United States Patent [19]
Ehrfeld et al.

[11] Patent Number: 5,194,402
[45] Date of Patent: Mar. 16, 1993

[54] METHOD OF PRODUCING MICROSENSORS WITH INTEGRATED SIGNAL PROCESSING

[75] Inventors: Wolfgang Ehrfeld; Friedrich Götz, both of Karlsruhe; Werner Schelb, Pfinztal; Dirk Schmidt, Stutensee, all of Fed. Rep. of Germany

[73] Assignee: Kernforschungszentrum Karlsruhe GmbH, Karlsruhe, Fed. Rep. of Germany

[21] Appl. No.: 340,175

[22] PCT Filed: Aug. 8, 1988

[86] PCT No.: PCT/DE88/00488
§ 371 Date: Apr. 10, 1989
§ 102(e) Date: Apr. 10, 1989

[87] PCT Pub. No.: WO89/01632
PCT Pub. Date: Feb. 23, 1989

[30] Foreign Application Priority Data
Aug. 14, 1987 [DE] Fed. Rep. of Germany ....... 3727142

[51] Int. Cl.⁵ ................... H01L 21/44; H01L 21/60
[52] U.S. Cl. ..................... 437/180; 437/195; 437/209; 437/229; 257/415
[58] Field of Search ............ 250/492.2; 427/43.1; 437/209, 229, 180, 183, 187, 195, 51, 60, 2, 3, 205, 203; 357/25; 148/DIG. 50; 205/123, 135, 157; 204/129.65; 73/862.68, 517 R, 777, 651

[56] References Cited
U.S. PATENT DOCUMENTS
3,993,515 11/1976 Reichert .................. 437/192
4,078,963 3/1978 Symersky ................. 437/228
4,943,539 7/1990 Wilson et al. ............ 437/195

FOREIGN PATENT DOCUMENTS
396276 11/1990 European Pat. Off. ........ 437/51
3328899 2/1985 Fed. Rep. of Germany .... 437/51

OTHER PUBLICATIONS
IEEE Transactions on Electronic Devices, vol. ED-29, No. 1, Jan. 82, IEEE (NY), Peterson et al., pp. 23-27.
Technische Rundschau, vol. 79, No. 13, 27 Mar. 1987, pp. 54-57.
Technische Rundschau, vol. 78, No. 35, Aug. 1986, pp. 32-37.

Primary Examiner—Olik Chaudhuri
Assistant Examiner—Loc Q. Trinh
Attorney, Agent, or Firm—Spencer, Frank & Schneider

[57] ABSTRACT

In the process described, the electronic circuits (2) for the signal processing and the sensor structures to which they are coupled are manufactured side by side on the common substrate (1). The process is characterized by the following steps: manufacture of the electronic circuits on the substrate (1) by known semiconductor techniques; application to the surface of the substrate (1) of a galvanic electrode layer (7), which may or may not be structured; application on the substrate surface containing the electrode layer of an X-ray resist layer (8), the thickness of which corresponds to a characteristic height of the sensor structures to be produced; production of negatives (10, 11) of the sensor structures in this resist layer (8) by X-ray lithography: galvanic deposition of a metal (12, 13) or a metal alloy in the negatives (10, 11) of the sensor structures using the galvanic electrode layer; division of the substrate with the sensor structures applied thereto into separate functional units or chips.

12 Claims, 9 Drawing Sheets

METHOD OF PRODUCING MICROSENSORS WITH INTEGRATED SIGNAL PROCESSING

BACKGROUND OF THE INVENTION

The invention relates to a method of producing microsensors with integrated signal processing wherein the electronic circuits for the signal processing and the sensor structures coupled therewith are produced on a common substrate immediately adjacent one another in space.

It is known to produce microsensors of this type by combining methods of semiconductor technology and the anisotropic silicon etching technology so as to produce on a silicon wafer in one process sequence the electronic circuits and the sensor structures coupled therewith. Such a manner of proceeding for the production of a capacitive acceleration sensor is described and illustrated by K. E. Petersen, A. Shartel and N. F. Raley, in "Micromechanical Accelerometer Integrated with MOS Detection Circuitry," IEEE Transactions on Electron Devices, Vol. ED-29, No. 1, January, 1982, pages 23 to 27. According to FIG. 1 of that publication, a structured p-doped layer is initially produced in the surface of an Si wafer as the electrode and etch stop layer. Then silicon is precipitated epitaxially to a thickness corresponding to the spacing of the electrodes and a structured silicon oxide layer is produced. By means of anisotropic etching, a contact hole is made through the opening in the silicon oxide layer, through the epitaxial silicon layer, down to the buried electrode. The source and drain regions and the electrical connection in the contact hole are produced by doping. Then the gate oxide is produced and an etching window is opened in the silicon oxide layer for the later formation of the sensor structure in the form of a reed. Then, the electrical connections are made and the reed region is metallized. As the last step, anisotropic silicon etching forms a trough between the buried electrode and the silicon oxide, thus creating a metallized silicon oxide reed which is able to vibrate.

The drawback of this processing sequence is that standard semiconductor processes such as, for example, oxidizing and doping, are employed in alternating succession with anisotropic silicon etching processes. This leads to problems in mass production since the use of alkali etching agents in the anisotropic etching process involves the danger of undesirable changes in the characteristics of the electronic circuits.

SUMMARY OF THE INVENTION

It is an object of the invention to make available a method of producing microsensors of this type in which the manufacturing steps for the sensor structures have no negative effect on the electronic circuits coupled therewith.

The above object is generally achieved according to the present invention by a method which includes the steps of:

producing the electronic circuits on the substrate according to processes known in the semiconductor art; applying a galvanic electrode on the substrate; applying a layer of an X-ray resist material on the substrate which has been provided with the galvanic electrode, with the thickness of the layer corresponding to a characteristic height of the sensor structures; producing negatives of the sensor structures in the layer by means of X-ray lithography; electrochemically depositing a metal or a metal alloy in the negatives of the sensors structures with the use of the galvanic electrode; and separating the substrate including the sensor structures applied thereto into individual functional units or chips.

The production of microstructures by X-ray lithographic means (LIGA method) is described and illustrated in Bericht KfK (Report KfK) 3995, November, 1985, published by Kernforschungszentrum Karlsruhe, to which reference is made.

The method according to the invention has the advantage that the production of the sensor structures is independent of the production of the electronic circuits and does not influence the latter.

Embodiments of the invention will be described below with reference to the drawing FIGS.

DETAILED DESCRIPTION OF THE PREFERRED EMBODIMENTS

Figure 1A:
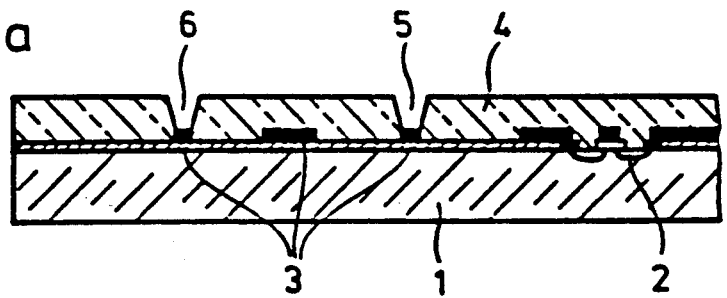
FIGS. 1a to FIG. 1e are schematic sectional views which depict various steps in the production of an inductive distance sensor according to the inventive method.

FIG. 1a is a schematic sectional view of a substrate in the form of a silicon wafer 1 to which an electronic circuit, symbolized by a MOSFET structure 2 and several conductor paths 3 (disposed on a non-numbered insulating layer on the substrate surface) have been applied according to methods known in the semiconductor art.

The entire wafer with the circuits disposed thereon is coated with an insulating protective layer 4 of silicon nitride into which, by means of lithographic and etching methods known for the production of semiconductors, contact openings 5, 6 were made above the corresponding locations of the circuits for the connecting surfaces of the sensor structure to be produced and for the external contacts of the circuits.

Figure 1B:
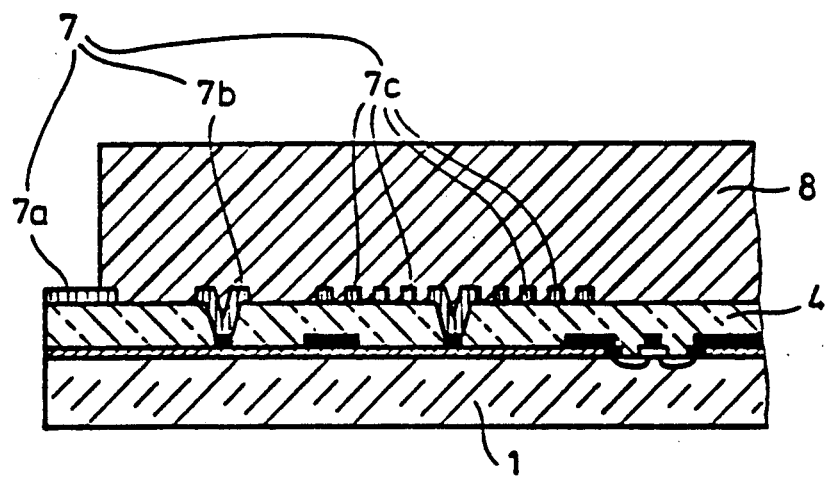

According to FIG. 1b, a conductive copper layer is sputtered onto this protective layer 4 and is structured by means of lithographic and etching methods in such a manner that, as specified by the layout of the sensor structures to be produced and as required by the necessary conductive paths and connections, a surface structured galvanic electrode (including portions 7a–7c as shown and portions 7d and 7e to the discussed below) 7 is produced.

Then the entire wafer 1 except for the copper plated annular edge 7a is coated with a 300 μm thick layer 8 of a positive X-ray resist material, e.g. polymethyl methocrylate (PMMA).

Figure 1C:
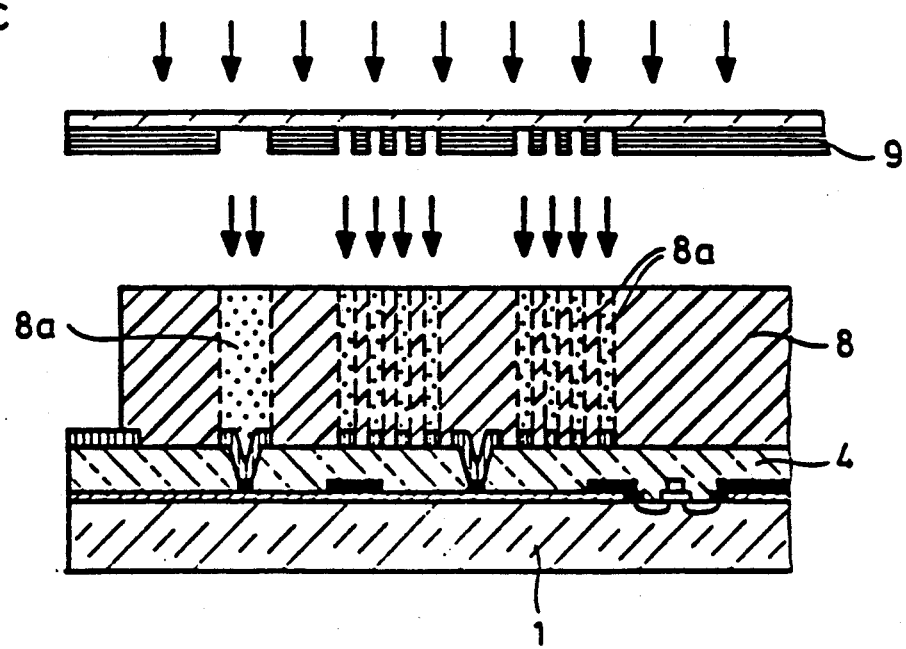
Figure 1D:
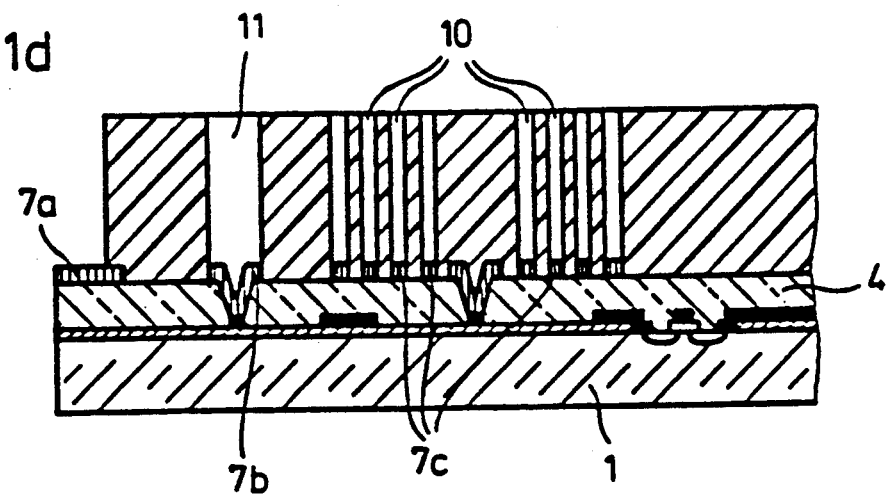
Figure 1E:
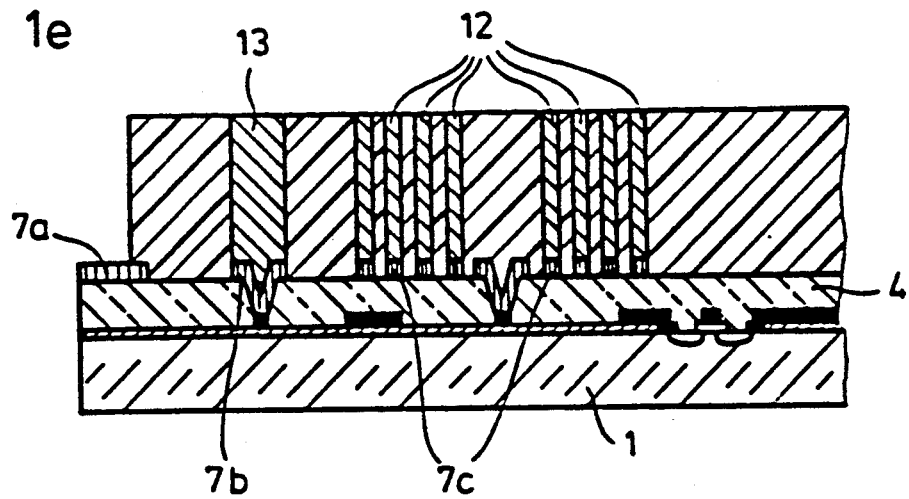

By way of an X-ray mask 9, the resist layer 8 is partially exposed to the X-rays of a synchrotron (see arrows in FIG. 1c). After dissolving out the irradiated regions 8a, of the X-ray resist layer 8 negatives 10, 11 of the sensor structures and the connection points result in the resist layer 8 (FIG. 1d). For this purpose, X-ray mask 9 must be adjusted in such a way that the resulting negatives 10, 11 are congruent or aligned with the previously structured galvanic electrode layer 7. Then copper is deposited electrochemically into negatives 10, 11, with galvanic electrode layer 7 being contacted above the annular edge 7a which has been kept free. After running a cutter over the surface of the resist material and the copper structures 12, 13 embedded therein (FIG. 1e) to a desired thickness of 250 μm, the substrate is sawed apart into individual sensor chips.

Figure 2:
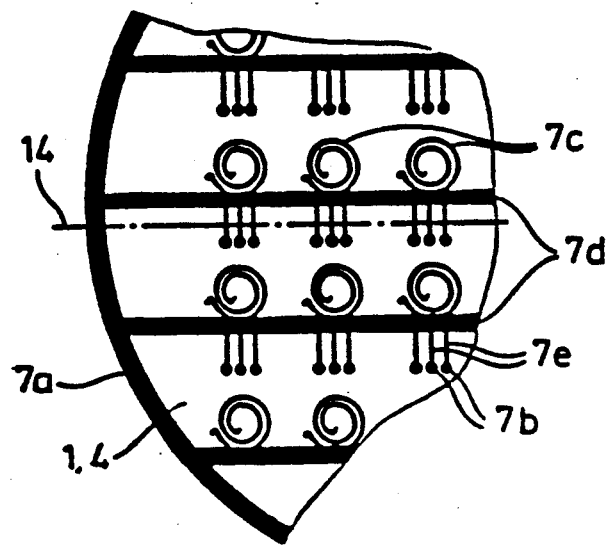
FIG. 2 is a schematic plan or top view of a section of the structural galvanic electrode layer 7 formed on the surface of the semiconductor wafer during the steps shown in FIG. 1b.

FIG. 2 is a top view of a section of the structured galvanic electrode layer 7 on the coated wafer 1, 4. Spiral-shaped portions 7c of electrode layer 7 corresponding to the layout of the sensor structures are connected in rows with the annular edge 7a of the galvanic electrode layer, while portions 7b, which correspond to the external contacts, are connected with the respectively closest path. When the wafer is separated into the individual chips, the electrical short-circuit connection existing via paths 7d and the bars 7e perpendicular thereto is interrupted between the external connections of the circuit (see section line 14).

Figure 3:
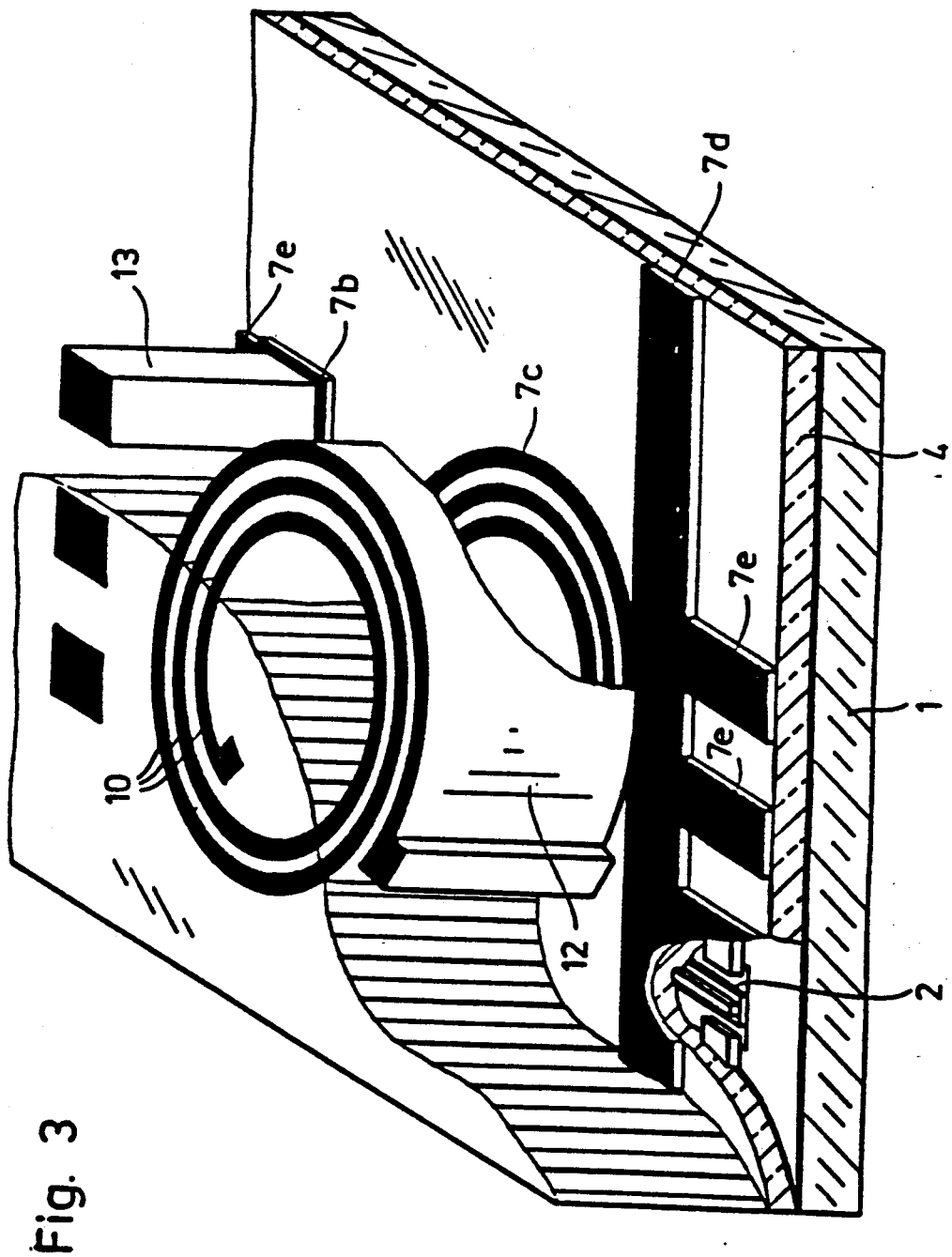
FIG. 3 is a schematic perspective view, partially broken open, of a device produced according to the method of FIGS. 1a –1e.

FIG. 3 is a schematic perspective view, partially broken open, of the thus produced distance sensor including a spiral-shaped plate coil 12 as the sensor structure, the structured galvanic electrode layer 7 and the electronic circuits 2 covered by insulating layer 4 on silicon wafer 1. For reasons of the ease of illustration, only a few windings are shown, not to scale, of plate coil 12 which is 250 μm high and has 50 windings, each turn having a width of 25 μm and a spacing between turns of 25 μm. External contacting is effected via columnar structures 13. The example shows that the method according to the invention is suitable for the mass production of sensors including inductively operating elements and integrated signal processing. Since the geometry of the sensor structure is freely selectable in the lateral direction, much more complicated sensor structures than those in this example can also be realized. The combination of characteristic dimensions in the micrometer range with a great structural height realized for the sensor structures produced according to the inventive method, it is possible to either miniaturize the sensor structures with their performance data remaining unchanged or their performance data (e.g. their current carrying capability) can be improved with their geometry remaining the same. Since the inventive method results in high precision for the geometry of the sensor structures and the integrated assembly eliminates the problems arising with connecting cables, costly matching and adjustment work is not required and the sensor element can be exchanged inexpensively if defective.

Figure 4:
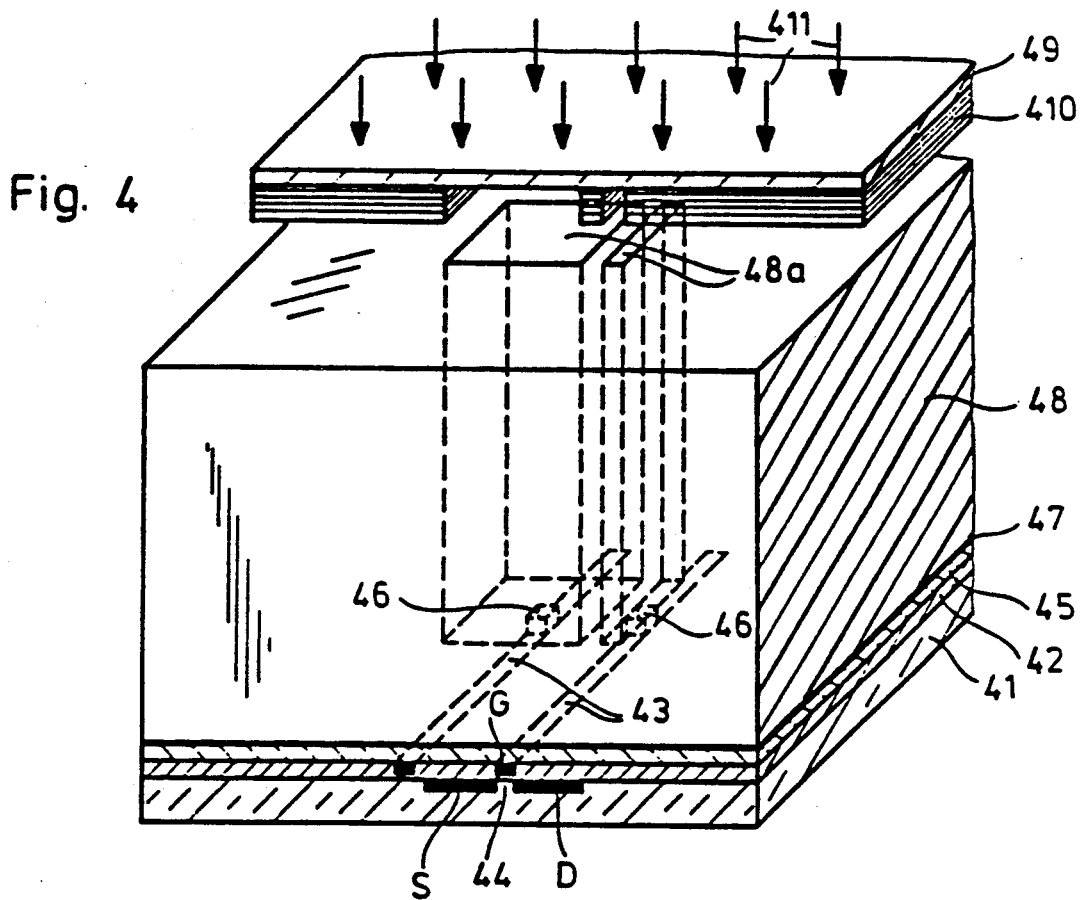
FIGS. 4-7 are schematic perspective views which depict various steps in the production of a capacitive vibration or acceleration sensor on and integrated with a semiconductor circuit according to the inventive method.

FIG. 4 is a perspective sectional view of a silicon wafer 41 on which an electronic circuit 44, an oxide layer 42 and conductor paths 43 have been produced according to methods known in the semiconductor art. An insulating protective layer 45, for example of silicon nitride, is applied onto the wafer. In a lithographic and etching step known in the semiconductor art, contact openings 46 are produced in the layer 45 to couple the sensor structure with the circuit. Now, for example by vapor-deposition, a conductive layer 47, for example of nickel, constituting the galvanic electrode and covering the entire substrate is applied to the substrate covered by protective layer 45. Then a layer 48 of an X-ray resist material is applied to a thickness of about 1000 μm. The resist layer 48 is exposed through an X-ray mask 49 including absorber structures 410 to the extremely parallel and intensive radiation 411 from, for example, a synchrotron.

Figure 5:
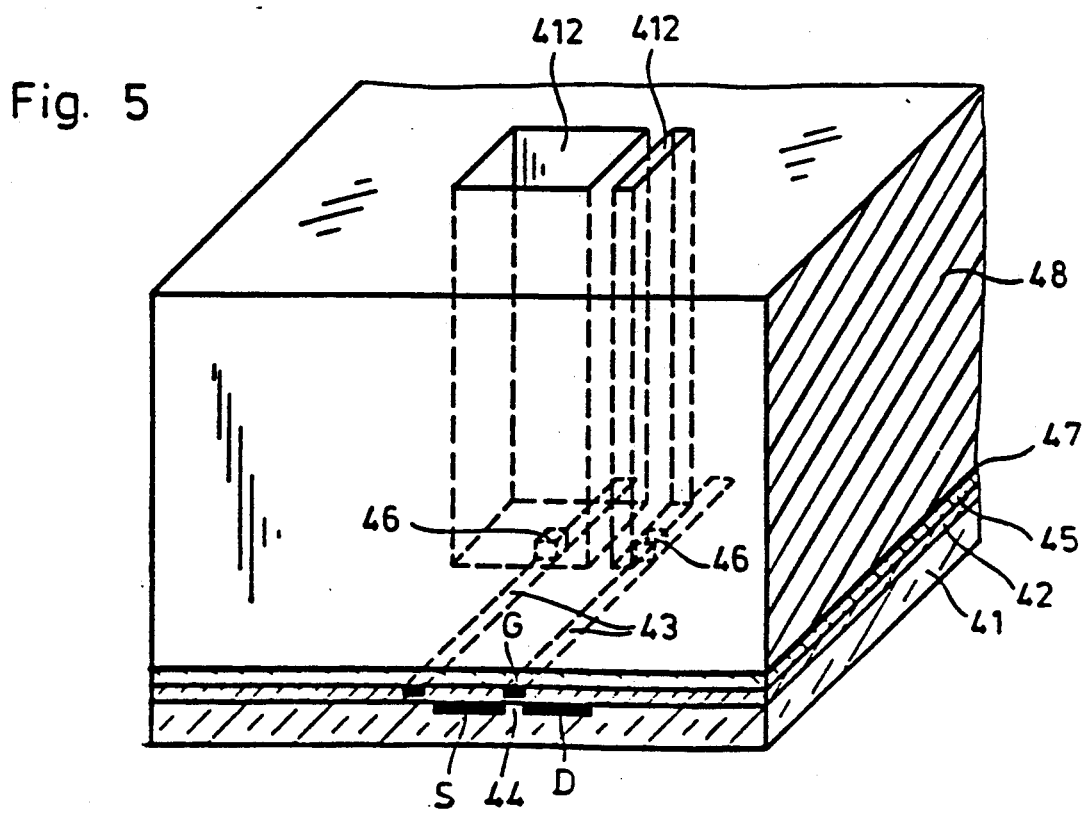
Figure 6:
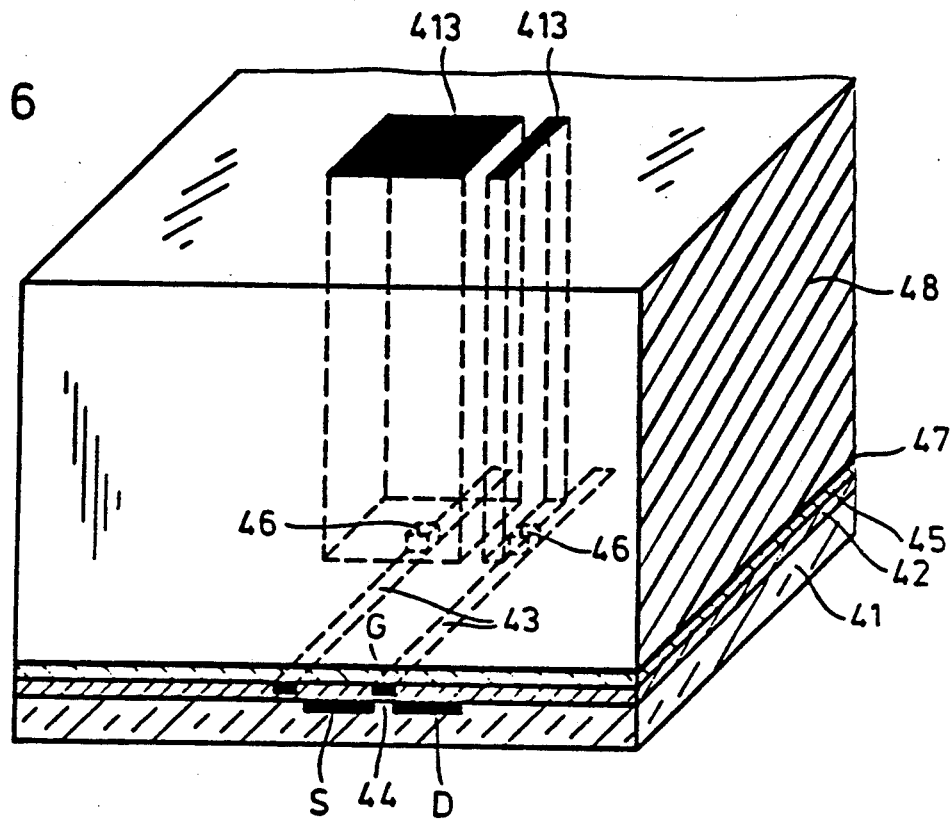
Figure 7:
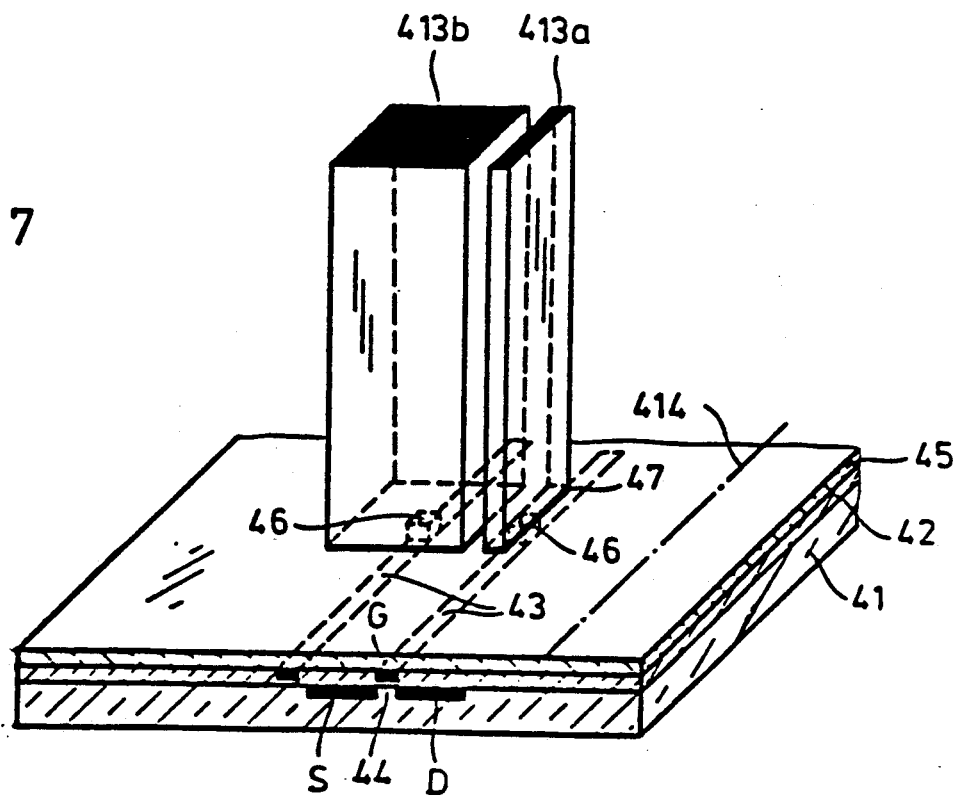

X-ray mask 49 is adjusted relative to wafer 41 in such a manner that the sensor structures to be produced result above the corresponding contact openings 46. The irradiation changes the regions 48a of resist layer 48 which are not shaded by the absorber structures in a radiationchemical manner. After the irradiation, the regions 48a of resist layer 48 which were exposed to the radiation are dissolved out during developing so that negatives 412 (FIG. 5) of the sensor structure result in the resist layer 48. With the use of conductive layer 47 as the galvanic electrode, a metal, for example nickel, is electrochemically deposited (FIG. 6) in these negatives 412 to produce the sensor structures 413. After the production of the metallic sensor structures 413, the remaining resist material 48 is stripped off and the exposed regions of conductive layer 47 are etched away, for example by dry etching (FIG. 7). The process is completed with the division of the wafer and the sensor structures applied thereto into individual functional units (chips), for example with the aid of a circular diamond saw which cuts along cutting line 414.

The thus produced sensor structure has a capacitance of, for example, 1 pF formed by an electrode that is capable of vibrating and has the shape of an exposed bar 413a which has a height of about 1000 μm, a width of 350 μm and a thickness of 3 μm and by a stationary counterelectrode 413b. The vibratable electrode 413a is connected directly with the gate G of, for example, a MOSFET circuit 44.

Because the geometry of the sensor structures is freely selectable in the lateral direction and the structural height can be varied up to a maximum of about 1000 μm, it is possible to produce with the inventive method capacitive acceleration sensors whose sensitivity and measuring range can be adapted optimally to the respective use of the sensor. Due to the large selection of metals for the electrodes of the capacitance, it is also possible to optimally adapt the vibratory behavior (frequency range) to the respective use of the sensor.

The use of a second counterelectrode on the other side of the bar makes it possible to easily compensate temperature errors due to thermal expansion of the electrodes and the wafer. The simultaneous development of two acceleration sensitive structures arranged at an angle to one another on one chip makes it possible to produce a biaxial acceleration sensor with integrated signal processing (not shown).

The production of a capacitive acceleration sensor particularly well suited for measuring small accelerations will now be described. Its production is based, according to FIG. 8, on a substrate 80 provided with an electronic circuit. A MOS transistor indicated schematically to comprise a source 80a, a drain 80b and a gate including gate oxide 80c serves as the connecting member between this circuit and the micromechanical sensor structure to be produced. For reasons of clarity, further elements of the circuit and the connecting contacts have been omitted. A polyimide layer 81 is applied onto substrate 80 which later serves as an intermediate layer to be removed again between parts of the sensor structures to be produced and the substrate. This layer 81 is structured by means of lithographic and etching methods in such a manner that a T-shaped opening 90 is produced above gate 80c of the MOS transistor and in an adjacent region (FIG. 9). Further openings 91, 92 are structured in such a manner that they correspond to the layout of the comb-shaped counterelectrodes of the sensor structure to be created.

Figure 10A:
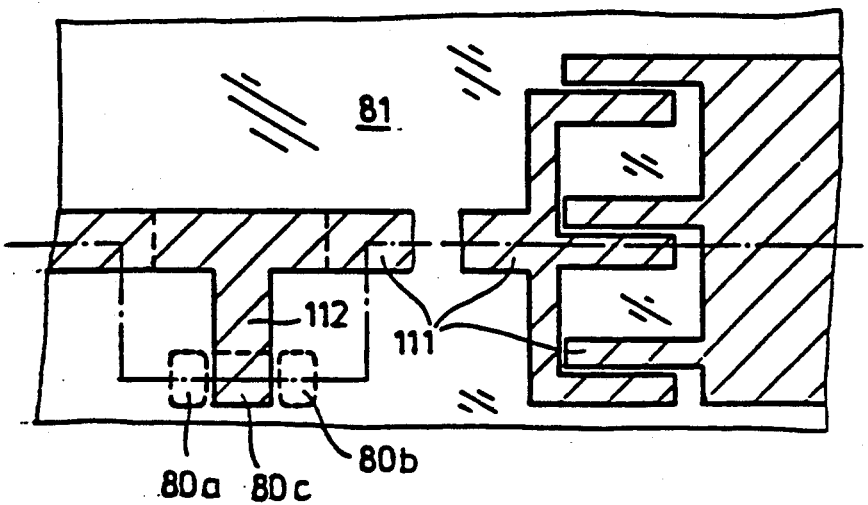
Figure 10B:
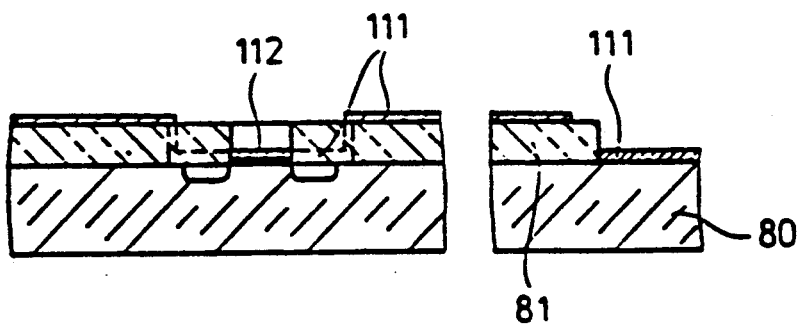
Figure 11:
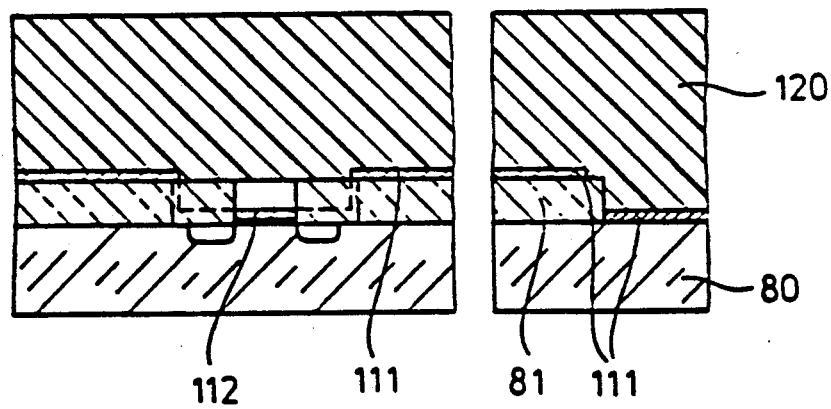
Figure 12:
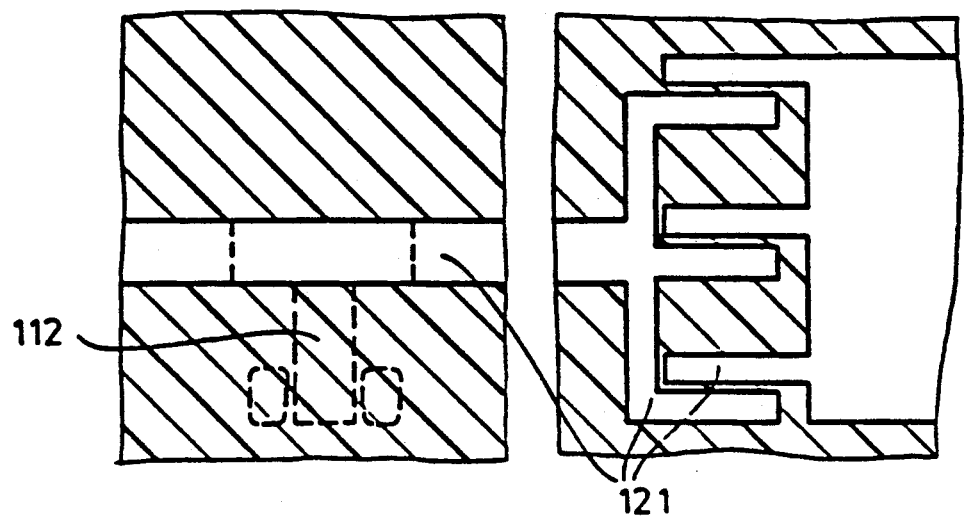

This is followed by a metallization of the surface with subsequent structuring of the metallization by lithographic and etching methods in such a manner that a structure remains which can be used as a galvanic electrode and, on the one hand, corresponds to the layout 111 of the sensor structure and, on the other hand, establishes an electrically conductive connection 112 with the gate 80c of the MOS transistor (FIGS. 10a, 10b). Now a thick layer 120 (FIG. 11) of a positive X-ray resist material is applied to the surface, and the resist layer 120 is then exposed in partial regions through an X-ray mask to synchrotron radiation such that, after dissolving away the irradiated regions, a negative 121 of the sensor structures results, with the dissolved away regions corresponding to the layout 111 of the sensor structures (FIG. 12).

Figure 8:
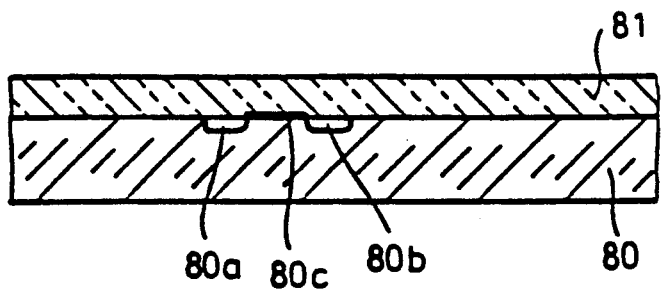
FIGS. 8, 9, 10a, 10b, 11 and 12 are schematic views which depict various steps in the production of a capacitive acceleration sensor, for measuring very slight accelerations, on and integrated with a semiconductor circuit, according to the inventive method, with FIGS. 8, 10b and 11 being cross sectional view and FIGS. 9, 10a and 12 being top views.
Figure 9:
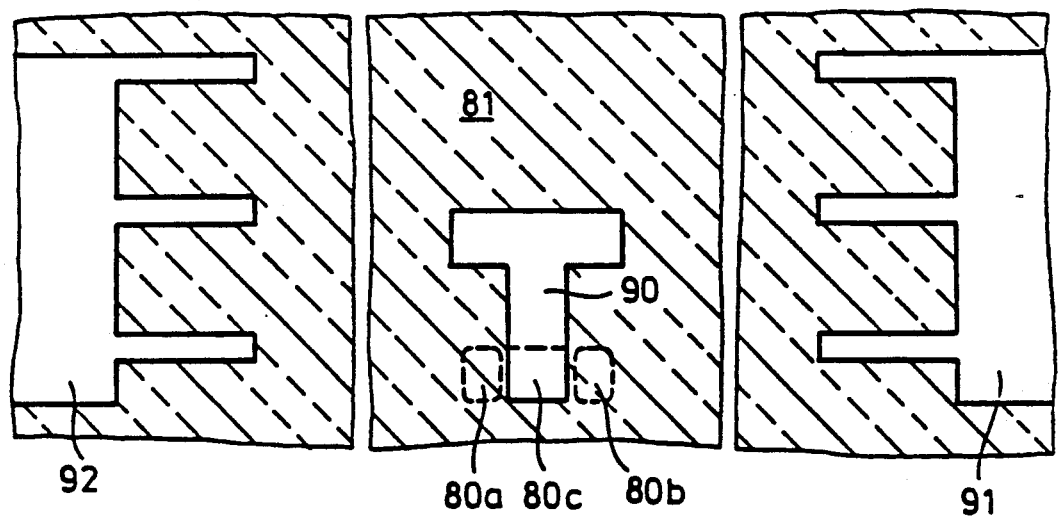

The polyimide intermediate layer 81 shown in FIG. 8 is not yet dissolved away.

Figure 13:
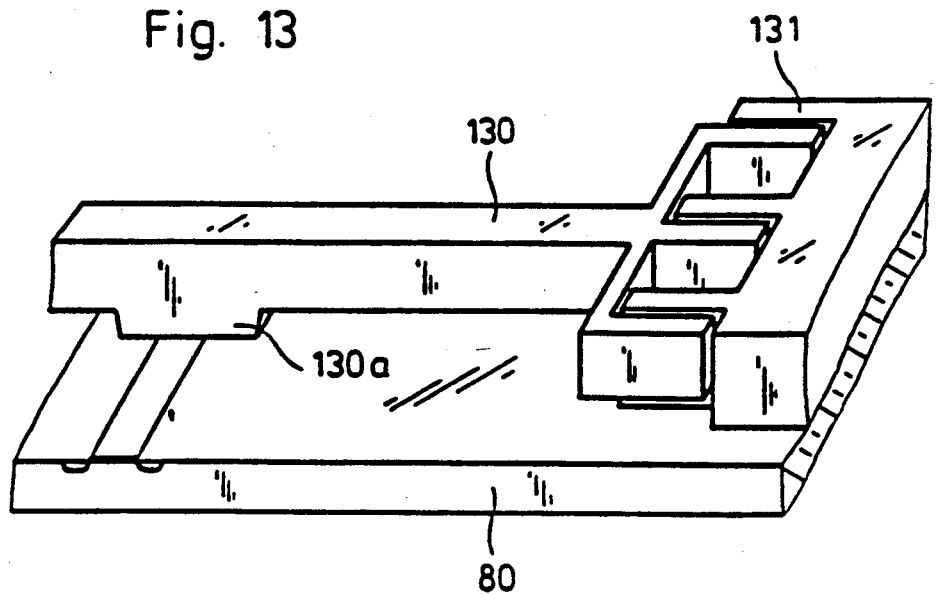
FIG. 13 is a schematic partial perspective view showing an acceleration sensor produced according to the method of FIGS. 8-12.
Figure 13:
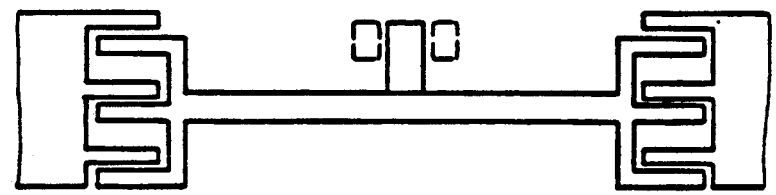

The thus produced recesses above layout 111 are then filled electrochemically with nickel, thus forming the sensor structure embedded in the resist material in the form of electrodes 130, 131 which mesh with one another in a comblike manner (FIG. 13). As the next step, possibly after first smoothing the surface, the substrate, on which a plurality of such sensor structures are constructed simultaneously, is separated into individual chips. Then the remaining resist material 120 (FIG. 12) is dissolved away and the polyimide intermediate layer 81 is chemically removed by means of an oxygen low pressure plasma.

As can be seen in FIG. 13, the one electrode 130 of the sensor structure has the shape of a bendable bar having comb-shaped ends. If the structure is symmetrical, the bendable bar 130 is fixed to substrate 80 only in its central region 130a while the remaining regions do not contact the substrate and are thus freely deflectable in the plane of the substrate. Counterlectrode 131, however, is fixed to substrate 80. The combs of electrodes 130 and 131 here mesh asymmetrically.

The described sensor arrangement including a symmetrical bendable bar has the advantage that very slight translatory accelerations can be measured independently of superposed angular accelerations, with the magnitude of the angular acceleration possibly lying in the same order of magnitude as the linear acceleration.

Figure 14:
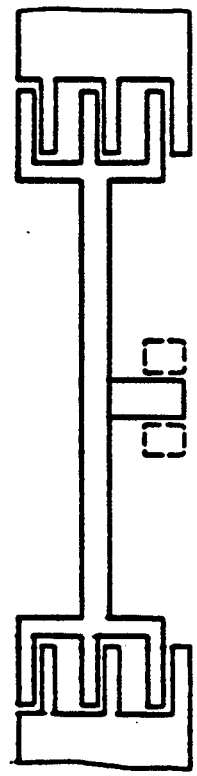
FIGS. 14 and 15 are schematic top views showing various layouts for a plurality of acceleration sensors produced according to the method of FIGS. 8-12.

Due to the simultaneous production of two such acceleration sensors at an angle perpendicular to one another on the same chip as shown in FIG. 14, it is possible to measure the linear acceleration free of any angular acceleration in two spatial directions without requiring additional adjustments.

Figure 15:
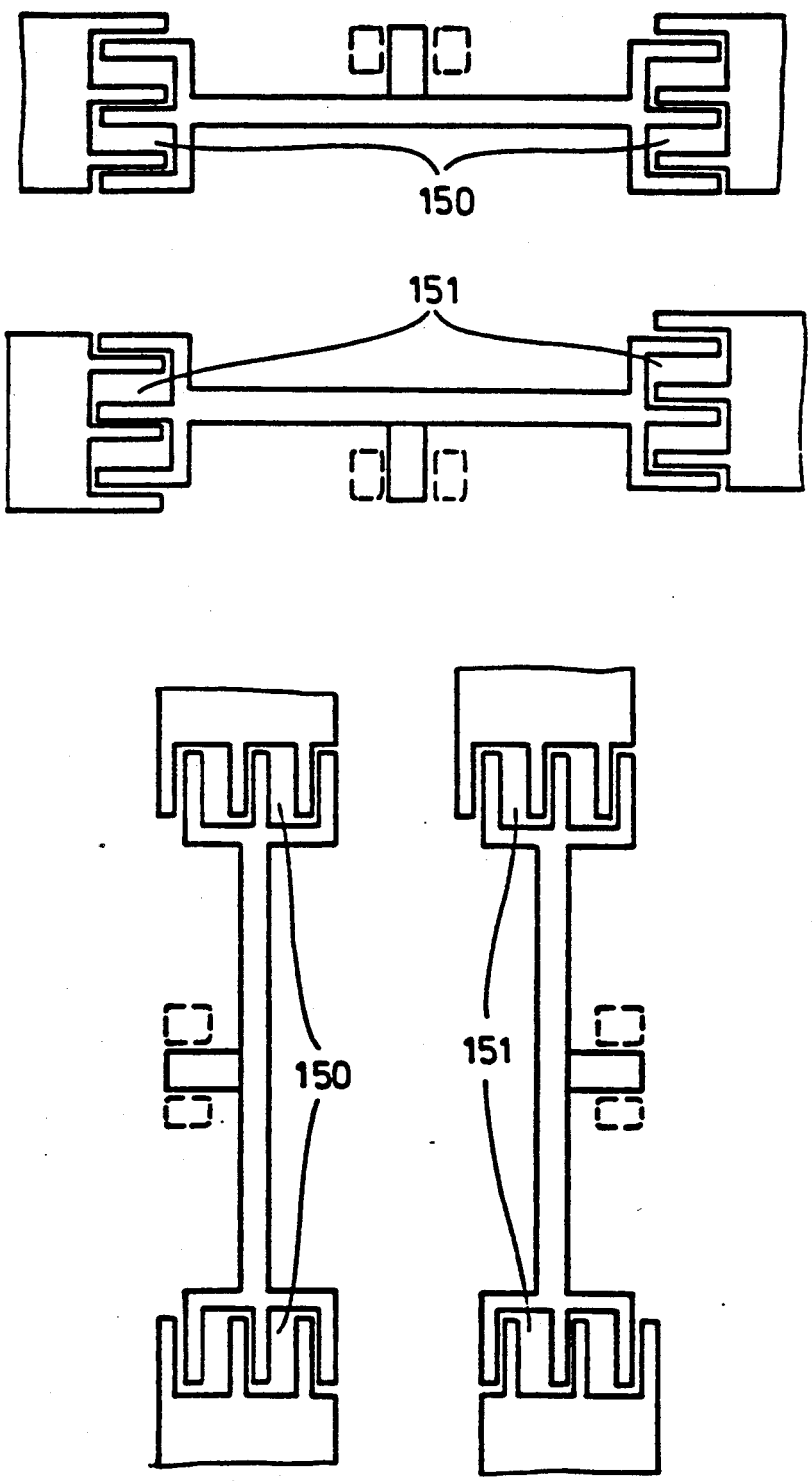

With a slightly modified embodiment according to FIG. 15, it is additionally possible to simultaneously measure linear and angular accelerations in that two sensor arrangements are produced parallel to one another on a common chip. The asymmetrical position of the combs relative to one another is here arranged in such a way that arrangement 150 responds only to linear accelerations and is insensitive to angular accelerations. The opposite is the case for arrangement 151; that is, it indicates angular accelerations while during linear accelerations the changes in capacitance on the left and on the right of the bendable bar compensate one another and no indication takes place.

The sensor structures may not only be constructed on the same side as the circuits, as described above, but also on the other side of the substrate. For complex arrangements, both sides of the substrate may also be provided with sensor arrangements. In these cases as well, spatially immediately adjacent production of the sensor structures and the respectively associated microcircuits for integrated signal processing coupled therewith are realized.

The resist material can be removed before or after the division of the substrate. Removal after the division has the advantage that the sensitive sensor structures are embedded in the resist material and are thus protected and sawing is facilitated.

We claim:

1. A method of producing electrical component microsensors with integrated signal processing wherein semiconductor electronic circuits for the signal processing and sensor structures coupled therewith are produced on a common substrate immediately adjacent one another in space, comprising the following steps:

producing the semiconductor electronic circuits on the substrate;

forming an insulating protective layer, including contact openings for coupling the sensor structures with the circuits, on the substrate;

applying a conductive layer to the insulating protective layer to serve as a galvanic electrode layer;

configuring the conductive layer to follow in its surface structure the layer out of the sensor structures and the necessary conductive paths and connections;

applying a layer of an X-ray resist material on the substrate surface which has been provided with the galvanic electrode, with the thickness of the resist layer corresponding to a height of the sensor structures to be produced;

producing negatives of the sensor structures in said X-ray resist layer by means of X-ray lithography;

electromechanically depositing a metal or a metal alloy in the negative of the sensor structures with the use of the galvanic electrode layer to form the sensor structures; and separating the substrate including the sensor structures applied thereto into individual functional units.

2. The method according to claim 1, further comprising removing the remaining X-ray resist material, before or after the separation of the substrate.

3. The method according to claim 2, further comprising:
applying an intermediate layer to parts of the substrate so as to extend below parts of the sensor structures to be produced; and,
removing said intermediate layer after the removal of the remaining X-ray resist material.

4. A method of producing electrical component microsensors with integrated signal processing wherein semiconductor electronic circuits for the signal processing and sensor structures coupled therewith are produced on a common substrate immediately adjacent one another in space, comprising the following steps:
producing the semiconductor electronic circuits on the substrate;
forming an insulating protective layer, including contact openings for coupling the sensor structures with the circuits, on the substrate;
applying a conductive layer covering the entire substrate to the insulating protective layer to serve as a galvanic electrode;
applying a layer of an X-ray resist material on the substrate surface which has been provided with the galvanic electrode, with the thickness of the resist layer corresponding to a height of the sensor structures to be produced;
producing negatives of the sensor structures in said X-ray resist layer by means of X-ray lithography;
electromechanically depositing a metal or a metal alloy in the negatives of the sensor structures with the use of the galvanic electrode layer to form the sensor structures; and
separating the substrate including the sensor structures applied thereto into individual functional units
removing the remaining X-ray resist material before or after the separation of the substrate; and
after removal of the remaining resist material removing the exposed regions of the conductive layer entirely or in part.

5. A method of producing electrical component microsensors with integrated signal processing wherein semiconductor electronic circuits for the signal processing and sensor structures coupled therewith are produced on a common substrate immediately adjacent one another in space, comprising the following steps:
producing the semiconductor electronic circuits on the substrate;
providing said substrate with an insulating layer on its surface, with the insulating layer having openings for at least making electrical connection to the electronic circuits;
forming a galvanic electrode layer on the substrate by applying a conductive layer to the surface of said insulating layer and within said openings, and structuring the conductive layer so that it forms a pattern corresponding at least to the shape of the sensor structures to be produced and of desired conductive paths;
applying a layer of an X-ray resist material on the substrate surface which has been provided with the galvanic electrode layer, with the thickness of the resist layer corresponding to a height of the sensor structures to be produced;
producing negatives of the sensor structures in said X-ray resist layer by means of X-ray lithography;
electromechanically depositing a metal or a metal alloy in the negatives of the sensor structures with the use of the galvanic electrode layer to form the sensor structures; and
separating the substrate including the sensor structures applied thereto into individual functional units.

6. A method of producing electrical component microsensor structures with integrated signal processing wherein the electronic circuits for the signal processing and the sensor structures coupled therewith are produced on a common substrate immediately adjacent one another in space, comprising the following steps:
providing a substrate having semiconductor electronic circuits on a surface thereof and with the surface being covered with an insulating layer;
providing openings in said insulating layer for coupling the electronic circuits to sensor structures to be produced, and providing further openings corresponding to a first portion of the sensor structures;
applying a conductive layer to the surface of said insulating layer and within said openings;
structuring the part of said conductive layer disposed on that surface of said insulating layer so that it corresponds to a further portion of the electrode structures;
applying a layer of an X-ray resist material on the surface of said conductive layer, with the thickness of the resist layer corresponding to a height for the sensor structures to be produced;
producing, an X-ray lithography, openings corresponding to negatives of the sensor structures in said resist layer at desired locations aligned with both the structured part of the conductive layer and the part of the conductive layer within said further openings;
electromechanically depositing a metal or a metal alloy in the openings corresponding to negatives of the sensor structures using said conductive layer as a galvanic electrode to form the sensor structures; and
dividing the substrate including the sensor structures applied thereto into individual functional units containing at least one sensor structures and its associated electronic circuit.

7. A method according to claim 6, further comprising removing portions of said insulating layer extending below said sensor structures after the step of removing any remaining portion of the X-ray resist material layer.

8. A method of producing electrical component microsensor structures with integrated signal processing wherein the electronic circuits for the signal processing and the sensor structures coupled therewith are produced on a common substrate immediately adjacent one another in space, comprising the following steps:
(a) providing a substrate having semiconductor electronic circuits on a surface thereof and with the surface being covered with an insulating layer;
(b) providing openings in the insulating layer for at least coupling the electronic circuits to sensor structures to be produced;
(c) applying a conductive layer to the surface of said insulating layer and within said openings;
(d) structuring the conductive layer so that it includes regions corresponding to said sensor structures and to necessary conductive paths and connections for the electronic circuits;
(e) applying a layer of an X-ray resist material on the surface of the structured said conductive layer, with the thickness of the resist layer corresponding to a height for the sensor structures to be produced;

(f) producing openings corresponding to negatives of the sensor structures in said resist layer at desired locations by X-ray lithography;

(g) electrochemically depositing a metal or a metal alloy in the openings corresponding to negatives of the sensor structures using said conductive layer as a galvanic electrode to form the sensor structures; and (h) dividing the substrate including the sensor structures applied thereto into individual functional units containing at least one sensor structure and its associated electronic circuit.

9. A method according to claim 8, further comprising the step of removing any remaining portion of the X-ray resist material layer either prior or subsequent to the step of dividing the substrate.

10. A method according to claim 9, wherein the conductive layer covers the entire surface of the insulating layer during said step (g) of electrochemically depositing; and further comprising removing exposed regions of the conductive layer, entirely or in part, after said step of removing any remaining portion of the X-ray resist material layer.

11. A method according to claim 10, wherein said steps of removing any remaining portion of the X-ray resist material layer and of removing exposed regions of the conductive layer are carried out prior to said step of dividing.

12. A method according to claim 8 further comprising: during said step (f), forming further openings in said resist layer corresponding to contacts for said conductive paths; and electrochemically depositing a metal or a metal alloy in said further openings during said step (g).

* * * * *